United States Patent [19]

Yamamoto

[11] Patent Number: 4,586,110
[45] Date of Patent: Apr. 29, 1986

[54] COMPOSITE PART OF PIEZO-ELECTRIC RESONATOR AND CONDENSER AND METHOD OF PRODUCING SAME

[75] Inventor: Takashi Yamamoto, Hakui, Japan

[73] Assignee: Murata Manufacturing Co., Ltd., Kyoto, Japan

[21] Appl. No.: 675,068

[22] Filed: Nov. 26, 1984

[30] Foreign Application Priority Data

Dec. 7, 1983 [JP] Japan ................... 58-232025

[51] Int. Cl.$^4$ ............... H01G 1/14; H01G 7/00; H01L 41/04; H03B 5/34
[52] U.S. Cl. ................... 361/307; 29/25.42; 310/311; 331/73
[58] Field of Search ............ 29/25.42; 310/311; 331/73; 323/370, 371; 361/306, 307, 323; 357/51

[56] References Cited

U.S. PATENT DOCUMENTS

| 2,887,649 | 5/1959 | Peck | 361/323 X |
|---|---|---|---|
| 3,236,936 | 2/1966 | Robinson | 361/307 X |
| 3,314,022 | 4/1967 | Meitzler | 310/311 X |
| 3,401,275 | 9/1968 | Curran et al. | 331/73 X |
| 3,636,386 | 1/1972 | Kawada | 331/73 X |

FOREIGN PATENT DOCUMENTS

| 239497 | 7/1962 | Australia | 361/306 |
|---|---|---|---|
| 151077 | 9/1983 | Japan | 310/311 |

*Primary Examiner*—Donald A. Griffin
*Attorney, Agent, or Firm*—Wenderoth, Lind & Ponack

[57] ABSTRACT

A composite part of a piezo-electric resonator and a condenser integrally joined together and a method of producing the composite part. A composite element is formed of a piezo-electric resonator and a condenser each provided with end electrodes at end portions thereof by fixedly integrating the piezo-electric resonator and the condenser under the condition that a gap serving as a vibration space is formed between the face of the piezo-electric resonator and the face of the condenser opposing the face of the piezo-electric resonator. This composite element is cut out of a pile of a laterally long piezo-electric resonator and a laterally long condenser by cutting it in the direction of width. This composite element is housed in a case and both end electrodes and a common electrode thereof are connected with lead terminals, the opening of the case being sealed.

5 Claims, 10 Drawing Figures

COMPOSITE PART OF PIEZO-ELECTRIC RESONATOR AND CONDENSER AND METHOD OF PRODUCING SAME

BACKGROUND OF THE INVENTION

The present invention relates to a composite part of a piezo-electric resonator and a condenser intergrated and housed in a case and a method of producing said composite part.

As shown in FIG. 1, in the conventional oscillating circuit using a piezo-electric resonator therein, a piezo-electric resonator 12 is connected with a signal-inventor 11 in parallel and the ends of said piezo-electric resonator 12 are respectively connected by load condensers $C_1$, $C_2$, and ground.

However, since said signal-inventor 11 is generally constructed from one condenser and said piezo-electric resonator 12 and load condensers $C_1$, $C_2$ are three outside parts in all, there are the following disadvantages:

(I) Since three parts are required for constructing the oscillating circuit, the management of parts becomes complicated.

(II) Since three parts are independently attached on the outside, the actual space of an oscillating circuit is increased, whereby a wider area is required for the substrate.

(III) Although the attachment of parts is achieved by soldering, it is preferable in respect of performance of the oscillating circuit that the number of places to be soldered is as small as possible. Where three outside parts are attached, the number of places to be soldered is increased, whereby it is difficult to produce an oscillating circuit, and further, the resulting oscillating circuit is wanting in fidelity. In addition, insufficient soldering leads to no oscillation or nonuniform oscillation.

(IV) Since outside parts are attached, the dispersion of said load condensers $C_1$, $C_2$ in capacity is multiplied by the dispersion of said piezo-electric resonator 12 in capacity to produce a dispersion in oscillating frequency, whereby the oscillating frequency is remarkably deteriorated in accuracy.

(V) Since a piezo-electric resonator, which is superior in the accuracy of frequency, must be produced by the vacuum deposition of Ag or the like on an excitation electrode while measuring oscillating frequency, an expensive large-sized vacuum deposition apparatus is required, whereby productivity is small.

OBJECT AND BRIEF SUMMARY OF THE INVENTION

The present invention was proposed in order to eliminate the above described disadvantages. That is to say, it is an object of the present invention to provide: (1) a composite part in which an assembly of a piezo-electric resonator and two condensers can be small-sized, the number of places to be soldered in production can be reduced, and the accuracy of oscillating frequency is superior, and (2) a method of producing said composite part at a lower cost by mass production.

This object of the present invention can be achieved by fixedly integrating a condenser provided with a common electrode on one side of a conductive substrate and an input-output electrode on another side of said conductive substrate and a piezo-electric resonator provided with opposite electrodes on both sides of a piezo-electric substrate while securing a vibration space between the face of said condenser and the face of said piezo-electric resonator opposing said face of said condenser, disposing an end electrode at each end portion of said condenser and said piezo-electric resonator to form a composite element, housing said composite in a case, and connecting lead terminals provided in said case with corresponding end electrodes and said common electrode to integrate said condenser and said piezo-electric resonator.

BRIEF DESCRIPTION OF THE DRAWINGS

The above and other objects and features of the invention will appear more fully hereinafter from a consideration of the following description taken in connection with the accompanying drawings wherein one embodiment is illustrated by way of example.

DETAILED DESCRIPTION OF THE PREFERRED EMBODIMENT

Figure 6:
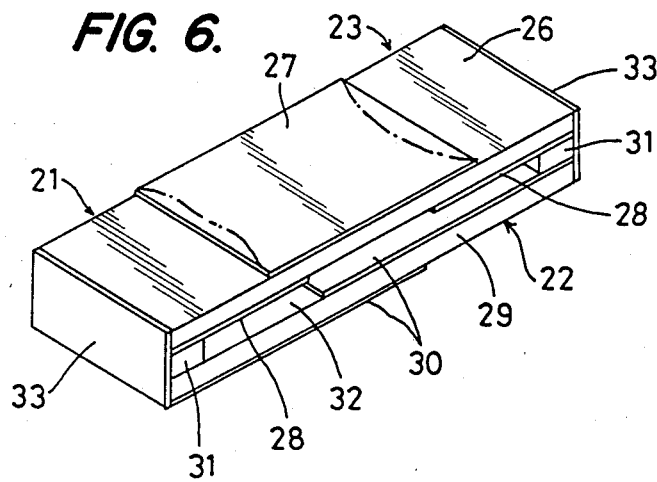
Figure 7:
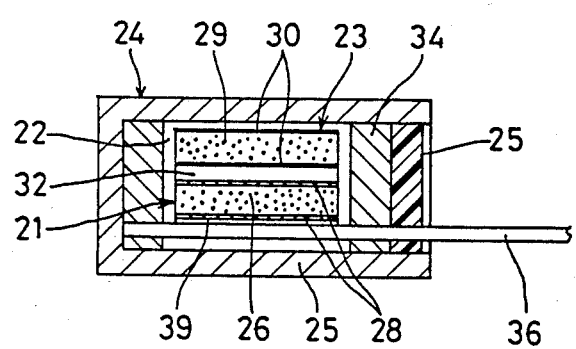
FIG. 7 is a vertical sectional view showing a piezo-electric resonator.
Figure 8:
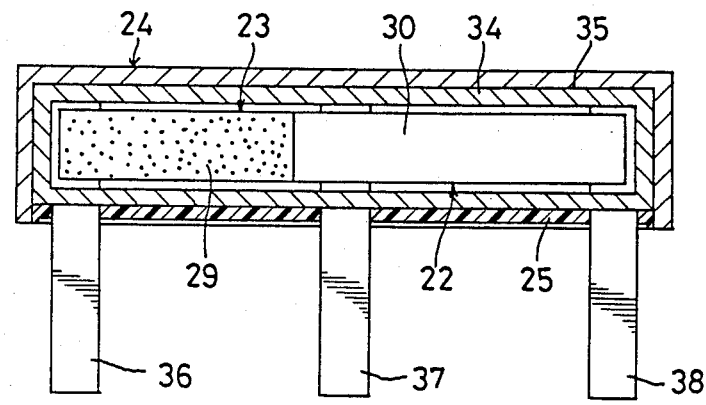
FIG. 8 is a horizontally sectioned plan view showing a piezo-electric resonator as shown in FIG. 7.

As shown in FIGS. 7 to 10, in a composite part according to the present invention, a composite element 23 obtained by fixedly integrating a condenser 21 and a piezo-electric resonator 22 as shown in FIG. 6 is housed in a case or housing 24, lead terminals provided on said case 24 being connected with corresponding electrodes of said composite element, and an opening of said case 24 being sealed with sealing agents 25 using instantaneously dryable synthetic resins or the like.

The condenser 21 is formed of a dielectric substrate 26 provided with a common electrode 27 on one side thereof and input-output electrodes 28 on another side thereof and provided with two load capacities.

The piezo-electric resonator 22 which vibrates in an energy trapped thickness shear mode is provided with opposite electrodes 30 on both sides of a piezo-electric substrate 29 formed in the form of thickness slide energy closed one, said piezo-electric resonator 22 and said condenser 21 being fixedly integrated by bonding opposite faces of both end portions with electro-conductive adhesives 31 such as organic electro-conductive adhesives with faces of said electrodes 30 opposing to each other so that said common electrode 27 may form the outside.

The electro-conductive adhesives 31 play a part for not only in fixedly bonding said condenser 21 to said piezo-electric resonator 22 but also in securing a gap 32, which serves as a vibration space of said piezo-electric resonator 22, between the face of said condenser 21 and the face of said piezo-electric resonator 22 facing said face of said condenser 21.

The condenser 21 and said piezo-electric resonator 22 bonded to said condenser 21 are provided with end electrodes 33 on both end surfaces thereof so that they may be communciated with said electrode 28 and 30 which extend to said both end surfaces.

The electrodes 28 of said condenser 21 is adapted to connectd with said electrode 30 of said piezo-electric resonator 22 through said end electrodes 33 and said electro-conductive adhesives 31.

In addition, bonding of said condenser 21 to said piezo-electric resonator 22 and the connection of said electrodes with them may be carried out using either said end electrodes or said electro-conductive adhesives.

The case 24 for housing said composite element 23 therein comprises a frame-like inside case 34 and an outside case 35 on said inside case 34 in combination, said inside case 34 being provided with lead terminals 36, 37, 38 integrally formed at both ends and the central portion thereof by molding.

The composite element 23 is inserted into said inside case 34 so that said common electrode 27 of said condenser 21 may be overlapped upon the surface portion of said lead terminal 37 exposed in said inside case 34, said lead terminals 36, 38 formed at both ends of said inside case 34 being fixedly connected to said end electrodes 33 with said electro-conductive adhesives 39, and said lead terminal 37 formed at the central portion of said inside case 34 being likewise fixedly connected to said common electrode 27 with electro-conductive adhesives 39.

Figure 10:
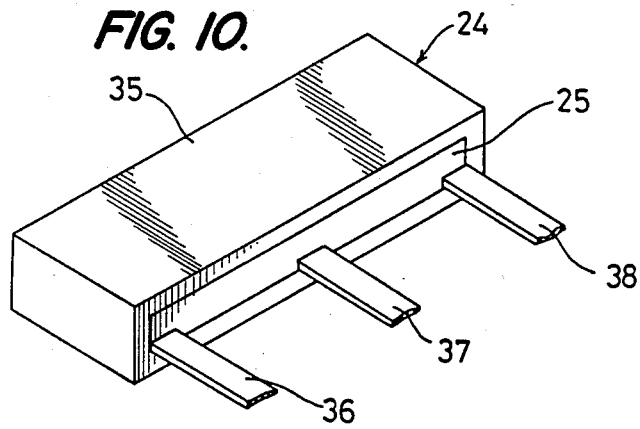
FIG. 10 is a perspective view showing an outward form of a piezo-electric resonator.

A composite part having the outside form as shown in FIG. 10 can be obtained by hermetically sealing the openings through which said lead terminals 36, 37, 38 of said outside case 35 put on said inside case 34 are pulled out, with said sealing agents 25.

Furthermore, said lead terminals 36, 37, 38 may be pulled out in the direction opposite to the direction as shown in FIG. 10 or the directions of both sides of said case 24.

Next, a method of producing a composite part according to the present invention will be described with reference to FIGS. 2 to 6.

Figure 2:
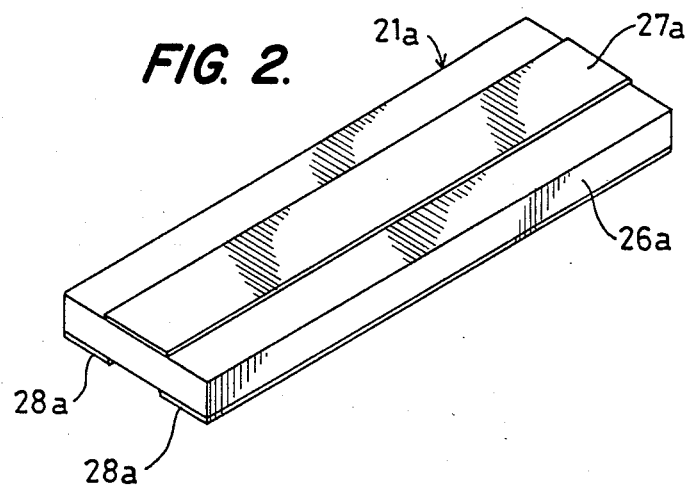
FIGS. 2 to 6 are diagrams illustrating a process of producing a composite element used in a piezo-electric resonator according to the present invention.
Figure 3:
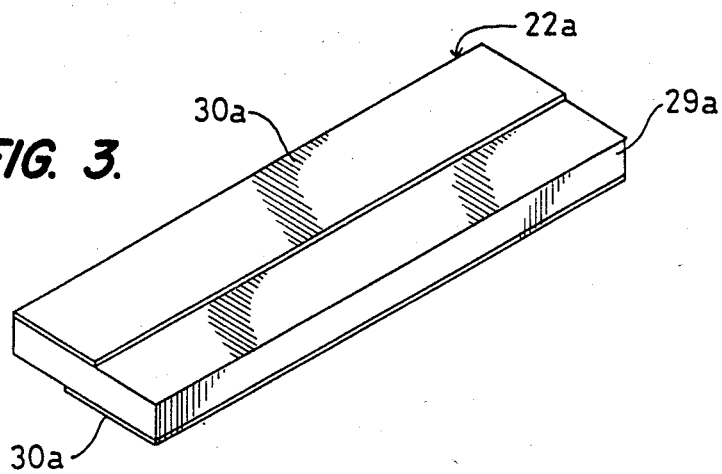

At first, a mother material 21a of said condenser 21 as shown in FIG. 2 and a mother material 22a of said piezo-electric resonator 22 are fabricated.

The mother material 21a of said condenser 21 comprises a laterally long mother material 26a of said dielectric substrate 26 provided with a common electrode 27a at the central portion of one side thereof and an input electrode 28a and an output electrode 28a disposed along the longitudinal direction thereof on both sides of another side thereof.

The mother material 22a of said piezo-electric resonator 22 comprises a laterally long mother material 29a of said piezo-electric resonator 22, which has the same plane size as said mother material 26a of said dielectric substrate 26, provided with opposite electrodes 30 along the longitudinal direction thereof on both sides thereof.

Figure 4:
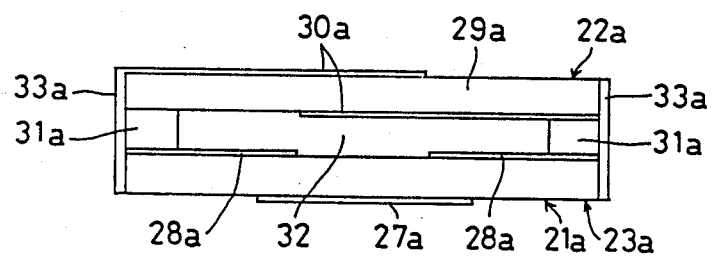

The mother material 21a of said condenser 21 is fixedly bonded to said mother material 22a of said piezo-electric resonator 22 with electro-conductive adhesives 31a on opposing faces at both longitudinal ends thereof with the faces of electrodes overlapping each other in a face-to-face relation so that said common electrode 27a may form the outside, as shown in FIG. 4.

In this way, a gap 32 used as a vibration space is formed between opposing faces of both of said mother materilas by utilizing a thick layer of said adhesives 31a and simultaneously end electrodes 33a are provided on end surfaces of both said mother materials on both longitudinal sides thereof.

Figure 5:
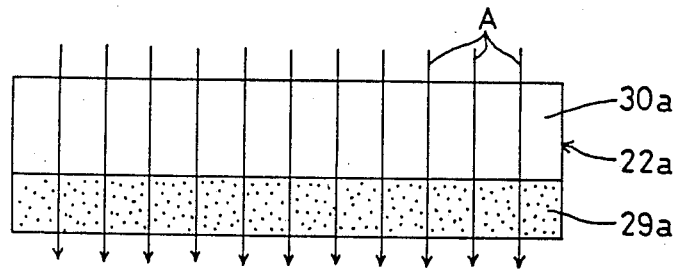

Then, a composite element 23, in which a condenser 21 and a piezo-electric resonator 22 are integrated, as shown in FIG. 6 can be obtained by cutting the resulting integrated body at regular intervals in the direction of the width thereof, as shown in FIG. 5.

The end electrodes 33, 33 provided on both ends of said composite element 23 are connected with a measuring terminal to cause oscillating to be produced and the oscillating frequency is adjusted to the appointed value by trimming areas formed at both ends of said common electrode 27 of load capacities by sandblasting or with laser rays or the like, as shown in FIG. 6 by a dotted chain line, while measuring of the oscillating frequency.

If said common electrode 27 is subjected to trimming, the load capacity is reduced and the oscillating frequency is increased.

Figure 1:
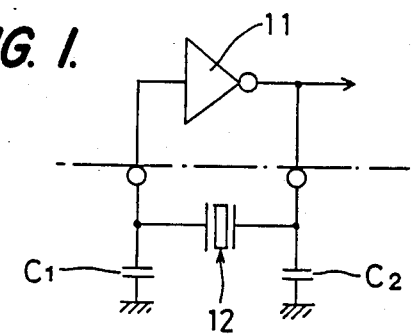
FIG. 1 is a diagram showing an oscillating circuit using a piezo-electric resonator therein.
Figure 9:
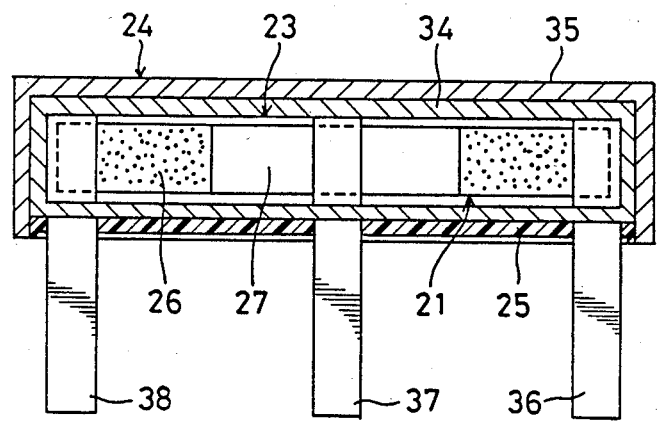
FIG. 9 is a horizontally sectioned bottom view showing a piezo-electric resonator as shown in FIG. 7.

After the adjustment of oscillating frequency, said composite element 23 is inserted into said inside case 34, which is integrally provided with said lead terminals 36, 37, 38 by molding, and said end electrodes 33 are connected with said lead terminals 36, 38 by the use of electro-conductive adhesives or reflow solder 39 while said common electrode 27 is likewise connected with said central lead terminal 37 by the use of orgainc electro-conductive adhesives or metallic adhesives such as reflow solder 39 (see FIG. 9). Then, said outside case 35 is put on said inside case 34 and openings of said outside case 35 are hermetically sealed with said sealing agents 25 to obtain a finished product. The same oscillating circuit as shown in FIG. 1 can be constructed by connecting the finished good with a signal inventor through said lead terminals 36, 37, 38.

In addition, where a frame-like inside case 34 is used, said lead terminals 36, 37, 38 may be mounted on the corresonding electrodes 33, 27, 33 and then the measurement of oscillating frequency may be carried out by the use of said lead terminals 36, 37, 38 in the same manner as described above.

Furthermore, it goes without saying that the construction of the package is not limited to the above described one.

As descirbed above, according to the present invention, the following effects can be achieved due to the above described construction:

(A) Since a condenser and a piezo-electric resonator are fixedly integrated while leaving a gap, which serves as a vibration space, between the face of said condenser and the face of said piezo-electric resonator facing said face of said condenser and the integrated assembly is housed in a case provided with lead terminals, a composite part comprising a condenser and a piezo-electric resonator and including two load capacities can be small-sized, whereby the space required for installation can be reduced.

It may be said in this connection that the outside form of the finished product can be reduced in size to about 8.5 mm (width)×4.5 mm (height)×2.5 mm (depth) in the range of 2 to 7 MHz.

(B) Since a condenser and a piezo-electric resonator can be compounded, the number of the places to be connected by soldering can be reduced, whereby the dispersion of oscillating frequency due to the connection by soldering can be reduced.

(C) Since a condenser and a piezo-electric resonator are compounded, the number of parts required in constructing an oscillating circuit can be reduced, whereby the control of parts can be simplified.

(D) Since the oscillating frequency can be adjusted by trimming a common electrode of the condenser, the dispersion of frequency resulting from the dispersion of the piezo-electric resonator and load capacities can be reduced from ±0.4% to ±0.1%.

(E) Since the oscillating frequency can be adjusted, the rate at which bad parts are produced becomes zero, the yield being remarkably increased, and it becomes possible to reduce the cost by mass production.

(F) Since the integration of a condenser and a piezo-electric resonator permits the incorporation of the integrated assembly in a case or the like to be mechanically carried out, the assembling process can be automatized.

What is claimed is:

1. A composite part of a piezo-electric resonator and a condenser, characterized by that said condenser comprising a dielectric substrate provided with a common electrode on one side thereof and an output electrode on another side thereof and said piezo-electric resonator comprising a piezo-electric substrate provided with opposite electrodes on both sides thereof are fixedly integrated under the condition that a gap, which serves as a vibration space, is formed between a face of said condenser and a face of said piezo-electric resonator facing said face of said condenser, said fixedly integrated condenser and piezo-electric resonator being provided with an end electrode at each end portion thereof form a composite element, said composite element being housed in a housing, and said housing being provided with lead terminals connected with said both end electrodes and said common electrode.

2. A composite part of a piezo-electric resonator and a condenser as set forth in claim 1, further comprising electro-conductive adhesives having a thickness, including at least one of organic electro-conductive adhesives and metallic adhesives such as solder, said adhesives fixing said condenser to said piezo-electric resonator with said gap being defined by the thickness of said adhesive.

3. A composite part of a piezo-electric resonator and a condenser as set forth in claim 1, in which said housing comprises a frame-like inside case, in which said composite element is housed, and an outside case covering said inside case, said inside case being provided with said lead terminals integrally molded therein, and openings, through which said lead terminals of said outside case extend out of said housing, hermetically sealed by sealing agents.

4. A composite part of a piezo-electric resonator and a condenser as set forth in claim 3, wherein said lead terminals include two end lead terminals and a central lead terminal between said end lead terminals, said common electrode of said condenser being disposed on a surface thereof which is exposed in said inside case, said common electrode overlapping said central lead terminal, both of said end lead terminals being fixedly connected to said end electrodes by said electro-conductive adhesives, and said central lead terminal being fixedly connected to said common electrode by said electro-conductive adhesives.

5. A method of producing a composite part of a piezo-electric resonator and a condenser, comprising the steps of:

forming a common electrode on one lonitudinally extending face of a dielectic mother substrate;

forming an output-input electrode on a face of the dielectric mother substrate opposite the one longitudinally extending face;

forming electrodes on opposite faces of a piezo-electric mother substrate;

integrating the mother substrates with one of the opposite faces of the dielectric mother substrate opposing one of the opposite faces of the piezo-electric mother substrate and a gap serving as a vibration space being formed between the opposing faces;

after said step of integrating, forming end electrodes on longitudinally opposite edges of the integrated mother substrates so at to be electrically connected to the input-output electrode and the electrodes on the opposite faces of the piezo-electric mother substrate;

after said step of forming end electrodes, cutting through the integrated mother substrates and end electrodes in a direction transverse to the longitudinal direction so as to obtain a plurality of composite elements, each consisting of a condenser and a piezo-electric resonator;

housing each composite element in a respective resin case provided with lead terminals, and connecting the end electrodes and the common electrode with corresponding ones of the lead terminals; and after said step of housing, hermetically sealing openings in the case.

* * * * *